United States Patent
Ekkart et al.

(10) Patent No.: US 6,798,252 B2
(45) Date of Patent: Sep. 28, 2004

(54) HIGH SPEED SENSE AMPLIFIER

(75) Inventors: Martin Ekkart, Munich (DE); Riccio Ettore, Munich (DE); Michael Moyal, Munich (DE); Dirk Schulz, Munich (DE)

(73) Assignee: Infineon Technologies AG, Münich (DE)

(*) Notice: Subject to any disclaimer, the term of this patent is extended or adjusted under 35 U.S.C. 154(b) by 179 days.

(21) Appl. No.: 10/110,173
(22) PCT Filed: Jul. 26, 2001
(86) PCT No.: PCT/EP01/08667
§ 371 (c)(1), (2), (4) Date: Oct. 28, 2002
(87) PCT Pub. No.: WO02/13198
PCT Pub. Date: Feb. 14, 2002

(65) Prior Publication Data
US 2004/0130352 A1 Jul. 8, 2004

(30) Foreign Application Priority Data
Aug. 7, 2000 (DE) .......................................... 100 38 383

(51) Int. Cl.$^7$ ............................................... G01R 19/00
(52) U.S. Cl. ..................................................... 327/53
(58) Field of Search ................................. 327/51–53, 66, 327/562, 565–566; 323/315; 330/257, 288; 365/207–208

(56) References Cited

U.S. PATENT DOCUMENTS

| | | | | |
|---|---|---|---|---|
| 4,994,730 A | * | 2/1991 | Rossi et al. | 323/316 |
| 6,507,523 B2 | * | 1/2003 | Pekny | 365/189.09 |
| 6,628,558 B2 | * | 9/2003 | Fiscus | 365/222 |

* cited by examiner

Primary Examiner—My-Trang Nu Ton
(74) Attorney, Agent, or Firm—Schiff Hardin LLP

(57) ABSTRACT

A high-speed sense current amplifier with a low power consumption for a memory cell, the sense current amplifier having: a first current mirror circuit, which amplifies a memory signal current received from the memory cell via a memory signal line and outputs it at a signal output of the sense current amplifier; a second current mirror circuit, which generates a setting current in a manner dependent on the received memory signal current; and an adjustable reference current source, which outputs a reference current to the signal output of the sense current amplifier, the magnitude of the output reference current being set, via a setting line, in a manner dependent on the setting current generated by the second current mirror circuit.

14 Claims, 6 Drawing Sheets

HIGH SPEED SENSE AMPLIFIER

BACKGROUND OF THE INVENTION

1. Field of the Invention

The invention relates to a high-speed sense current amplifier with a low power consumption for a memory cell.

2. Description of the Related Art

Semiconductor memories are binary data memories in which the individual memory cells SZ are arranged in matrix form and comprise semiconductor components, in particular transistors. In this case, the memory cells SZ are connected to word lines WL and bit lines BL, running perpendicularly thereto. The matrix contains n*m memory cells. The addressing, i.e. the selection of a memory cell SZ or a memory word, is effected by activation of the word lines WL. In this case, the addressing is performed by an address decoder which, given n external address lines, internally generates $2^n$ selection signals for word line and bit line selection. The data information items contained in the memory cells SZ are read out via a sense amplifier.

FIG. 1 schematically shows the construction of a semiconductor memory arrangement. The address decoder D is connected to an address bus AR and decodes the addressing signal present on the address bus AR for the selection of memory cells SZ within the semiconductor memory. The read-out data contained in the memory cells SZ pass via memory signal lines to a multiplexer MUX, which is connected to the sense amplifier on the output side. The sense amplifier amplifies the received memory signal and outputs it to a data bus DR via an output buffer P.

FIG. 2 schematically shows part of a sense current amplifier for the read-out and amplification of the data content contained in a memory cell SZ, according to the prior art.

The memory cell SZ contains a data bit information item, the memory cell SZ being in a logic low state L(low) or a logic high state H(high). The memory cell SZ may be a RAM memory cell or a ROM memory cell. The memory cell SZ is addressed via a word line WL leading away from the decoder D and outputs the data content contained in it via the bit line BL. In this case, a memory signal current $I_{BL}$ flows via the memory signal line or bit line BL to the multiplexer MUX. The memory signal current $I_{BL}$ is zero if the memory cell SZ is in a logic low state L. If the memory cell SZ is in a logic high state H, a predetermined memory signal current $I_{BL}$ flows. The bit line BL has a line capacitance and can be precharged or recharged via a charging circuit comprising e.g. a clocked MOSFET transistor. The multiplexer MUX is controlled in a manner dependent on a selection signal SS1 and through-connects the memory signal line BL to the input E of the sense current amplifier LSV. The sense current amplifier LSV contains a current mirror circuit which is supplied with a supply voltage $V_{DD}$. On the output side, the current mirror circuit is connected to a node which is connected to the output A of the sense current amplifier LSV according to the prior art. The current mirror circuit amplifies the memory signal current $I_{BL}$ received via the input E with a constant factor K and outputs the amplified current $K \cdot I_{BL}$ at the output A of the sense current amplifier LSV. Furthermore, at a reference current source terminal REF, a reference current source is connected to the current node connected to the output A. The reference current source according to the prior art is likewise connected to the supply voltage $V_{DD}$ and can be selected by means of a selection signal SS2. The summation current node has an intrinsic capacitance $C_A$.

FIG. 3 shows the reference current source according to the prior art as illustrated in FIG. 2. The reference current source contains a plurality of N-MOSFET transistors T1, T2, and T3. The N-MOSFET transistor T1 of the reference current source generates a constant current in a manner dependent on the selection signal SS2. If the selection signal SS2 is logic 0, the constant current $I_K$ of the MOSFET transistor T1 is zero. Conversely, if the selection signal SS2 is switched on, a constant current $I_K\phi$ with a specific constant current magnitude flows through the N-MOSFET transistor T1. The following hold true:

$I_K=0$ if $SS2=1$ $I_K=I_{K\phi}$ if $SS2=\phi$ \hfill (1)

The reference current source according to the prior art furthermore contains a current mirror circuit comprising the two N-MOSFET transistors T2 and T3, the two gate terminals of the two N-MOSFET transistors T2 and T3 being connected to one another and having a direct connection to the source terminal of the N-MOSFET transistor T1. The constant current $I_{K\phi}$ is mirrored by the current mirror circuit T2 and T3, the current gain being determined by the current channel width/length ratio W/L of the two transistors T2 and T3.

The N-MOSFET T2 of the current mirror circuit has a source terminal connected to ground and a drain terminal connected to the reference current terminal REF. The current mirror circuit T2 and T3 generates a constant reference current $I_{REF\phi}$ at the reference current terminal REF, the following holding true:

$$I_{REF\phi} = \frac{\mu C_{ox} W/L}{2}(V_{GS} - V_T)^2 \qquad (2)$$

where:
W/L is the channel width/length ratio of the transistor T2,
$C_{ox}$ is the capacitance of the dielectric,
$V_T$ is the threshold voltage of the transistor T2, and
$V_{GS}$ is the gate/source voltage of the transistor T2.

Since the voltage $V_{GS}$ between the gate and the source of the transistor T2 is constant and the remaining quantities are also predetermined, the reference current $I_{REFO}$ generated by the reference current source is constant.

FIG. 4 shows the current mirror circuit contained in the sense current amplifier according to the prior art. The current mirror circuit contains two P-MOSFETs T4 and T5, whose gate terminals are connected to one another and are connected to the input E of the current mirror circuit. The two drain terminals of the two P-MOSFETS T4 and T5 are connected to the supply voltage potential $V_{DD}$. The source terminal of the first P-MOSFET T4 is likewise connected to the signal input E of the current mirror circuit and receives the memory signal current $I_{BL}$. The channel width/length ratios W/L of the two P-MOSFETs T4 and T5 are defined in such a way that the memory signal current $I_{BL}$ is output amplified by a fixed gain factor K at the source terminal of the second P-MOSFET T5.

In the conventional sense current amplifier, as illustrated in FIG. 2, the following holds true for the output voltage at the output A:

$VA=VDD$ if $K^*I_{BL} \geq I_{REF\phi}$ $VA=\phi$ if $K^*I_{BL} < I_{REF\phi}$ \hfill (3)

In the conventional sense current amplifier according to the prior art, as illustrated in FIG. 2, one disadvantage is that a high reading speed for the readout of the memory cell SZ and a low power consumption P of the sense current amplifier LSV cannot be achieved simultaneously. This will be explained below with reference to the signal profile illustrated in FIG. 5. If the memory cell SZ is not being read, the output A of the sense current amplifier LSV is at a predetermined high potential corresponding to the supply voltage $V_{DD}$. If the memory cell SZ is not being read, the memory signal current $I_{BL}$ is 0.

At the instant $t_1$, a read operation A is initiated in the example illustrated in FIG. 5, in the course of which a memory cell SZ which is in a logic low state L is read. When reading from a memory cell SZ which assumes a logic low state L, a memory signal current $I_{BL}$ of zero is generated, so that an output current of $K*I_{BL}$ which is lower than the constant reference current $I_{REF\phi}$ flowing into the reference current source is also output at the output of the current mirror circuit. Since the reference current $I_{REFO}$ flowing from the current node is greater than the amplified memory signal current ($K*I_{BL}$) flowing into the current node A, the intrinsic or parasitic capacitance $C_A$ at the output A of the sense current amplifier LSV according to the prior art is discharged, so that the output voltage $V_A$ at the output A of the sense current amplifier falls, as is illustrated in FIG. 5.

The discharge process at the output A of the sense current amplifier LSV takes place more quickly the higher the constant reference current $I_{REFO}$. The discharge process lasts for a relatively long time in the case of a relatively low reference current $I_{REFOA}$ while the discharge process takes place quickly in the case of a relatively high reference current $I_{REFC}$.

For the discharge time τ of the intrinsic capacitance $C_A$ at the output A of the sense current amplifier LSV according to the prior art, the following therefore holds true to an approximation:

$$\tau \cong V_{DD}/I_{REF\phi} * C_A \quad (4)$$

The faster the discharge process takes place at the 5 output A of the sense current amplifier LSV, the higher the read-out speeds that can be achieved by means of the semiconductor memory.

At the instant $t_2$, the read operation A is ended and the output node A of the sense current amplifier is charged again. At the instant $t_3$, a further read operation B is initiated, in the course of which the memory cell SZ is this time read in a logic high state H. In this state, the memory cell SZ yields a memory signal current $I_{BL}$ of predetermined magnitude which is amplified by the current mirror circuit. Since the amplified signal current $K*I_{BL}$ is greater than the constant reference current $I_{REFO}$, the output voltage VA at the output A of the sense current amplifier, in accordance with equation (3), is $V_A=V_{DD}$.

The following problem area exists in the case of the conventional sense current amplifier LSV, as illustrated in FIG. 2. The higher the constant reference current $I_{REFO}$, the shorter the discharge time τ and the shorter the possible read-out times of the memory. However, this has the result that, in accordance with equation (3), the current gain K through the current mirror circuit must be high enough, when reading from a memory cell SZ which is in a logic high state, to satisfy the inequality condition and to switch reliably to the high voltage potential $V_{DD}$ at the output A. However, a high gain factor K of the current mirror circuit is equivalent to a high power loss P of the sense current amplifier LSV. The high power loss P entails a number of disadvantages. The higher the power loss P, the higher the temperature T generated by the sense current amplifier LSV, thus necessitating cooling devices, under certain circumstances. Furthermore, wider power supply lines become necessary in an integrated sense current amplifier LSV, in order to achieve the required power. A further disadvantage is that, in the case of battery-operated sense current amplifiers LSV, the batteries have to be recharged at shorter time intervals. This has considerable disadvantages in particular in the case of portable devices containing semiconductor memories, such as e.g. portable telephones.

SUMMARY OF THE INVENTION

Therefore, an object of the present invention is to provide a sense current amplifier which, on the one hand, enables a high speed when reading from a semiconductor memory and at the same time has a low power consumption.

The invention provides a high-speed sense current amplifier with a low power consumption for a memory cell, the sense current amplifier having: a first current mirror circuit, which amplifies a memory signal current received from the memory cell via a memory signal line and outputs it at a signal output of the sense current amplifier; a second current mirror circuit, which generates a setting current in a manner dependent on the received memory signal current; and an adjustable reference current source, which outputs a reference current to the signal output of the sense current amplifier, the magnitude of the output reference current being set, via a setting line, in a manner dependent on the setting current generated by the second current mirror circuit.

Preferred embodiments of the high-speed sense current amplifier according to the invention are described below with reference to the accompanying figures for elucidating features that are essential to the invention.

DETAILED DESCRIPTION OF THE PREFERRED EMBODIMENTS

Figure 1:
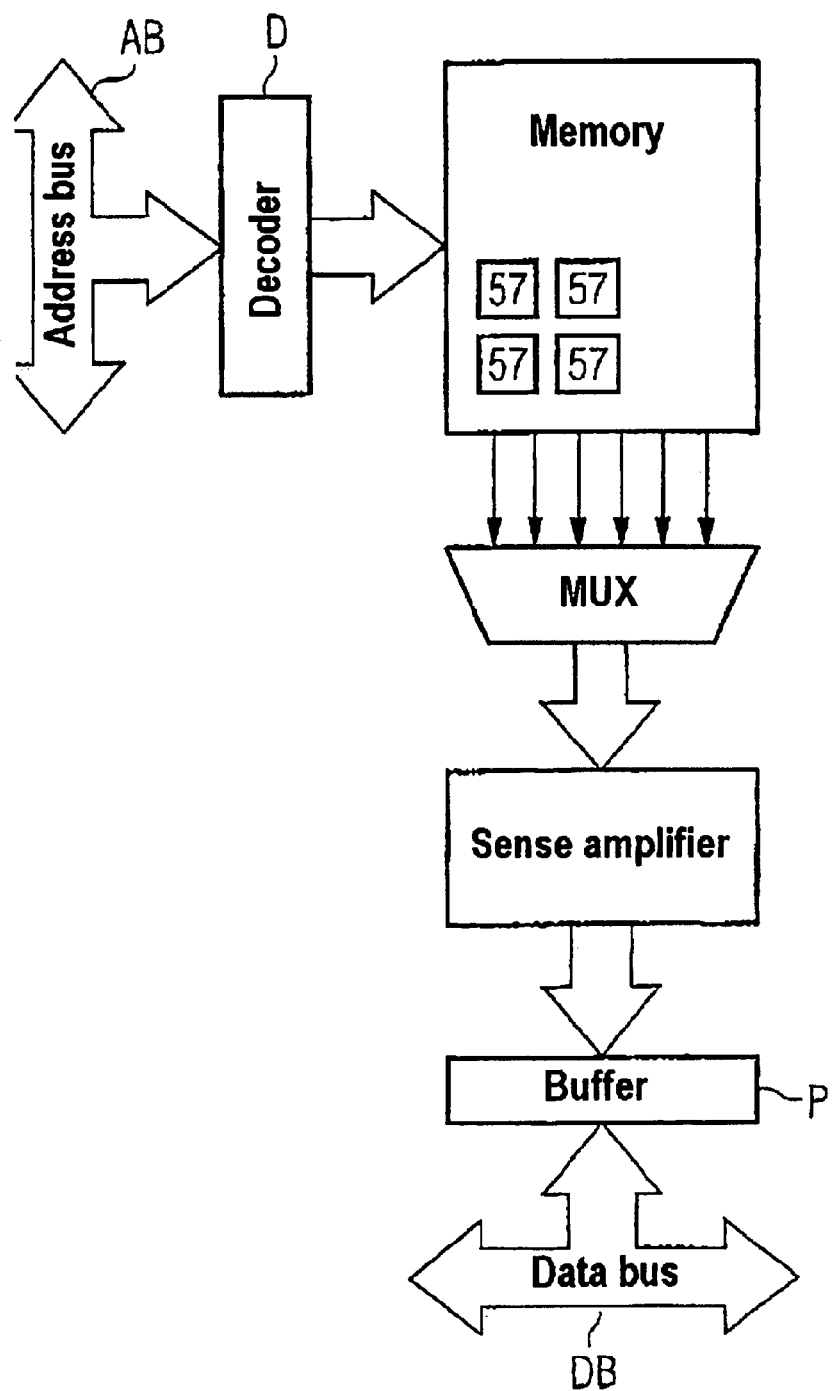
FIG. 1 shows a block diagram of a conventional semiconductor memory arrangement according to the prior art.
Figure 2:
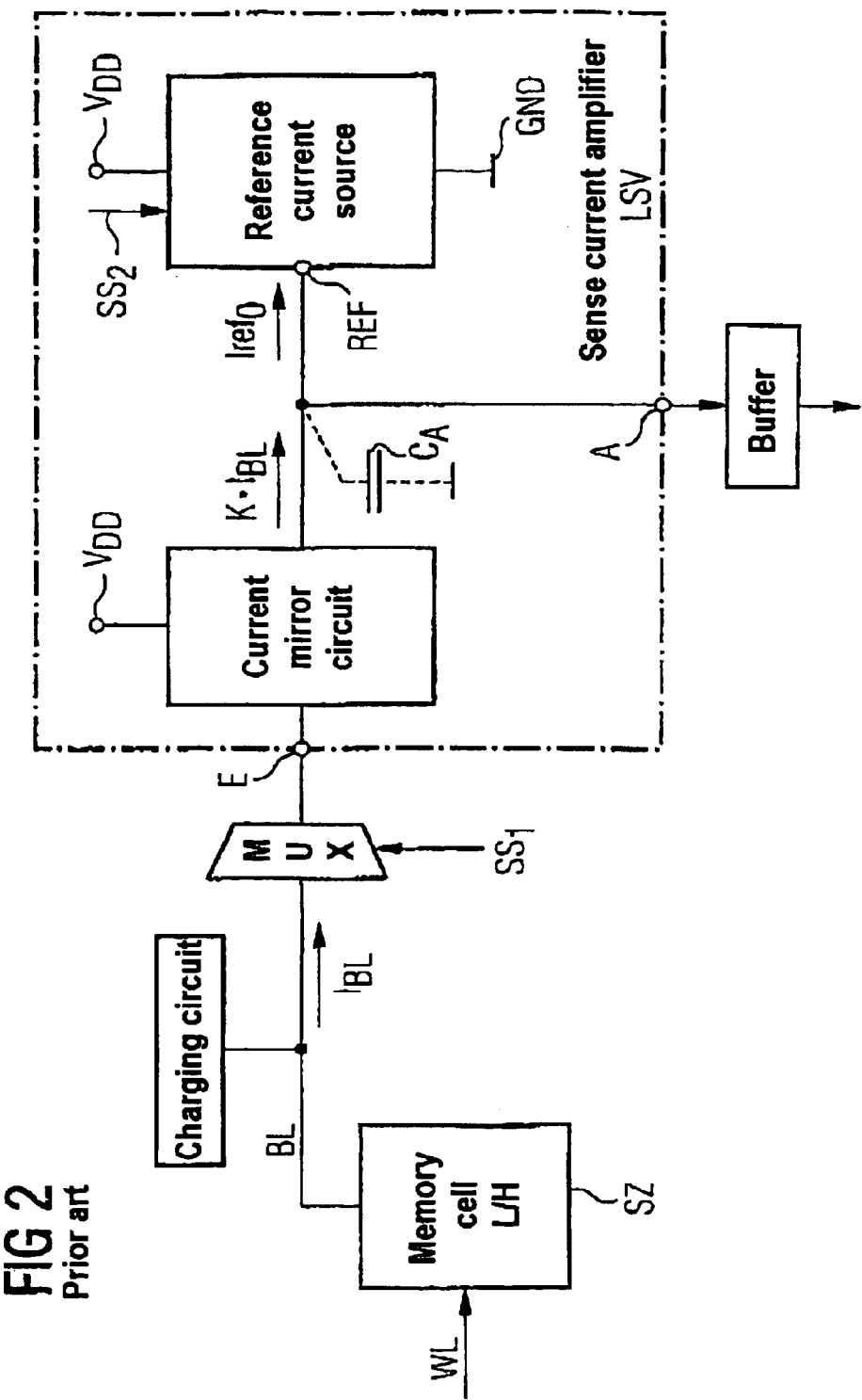
FIG. 2 shows a circuit diagram with a sense current amplifier LSV according to the prior art.
Figure 3:
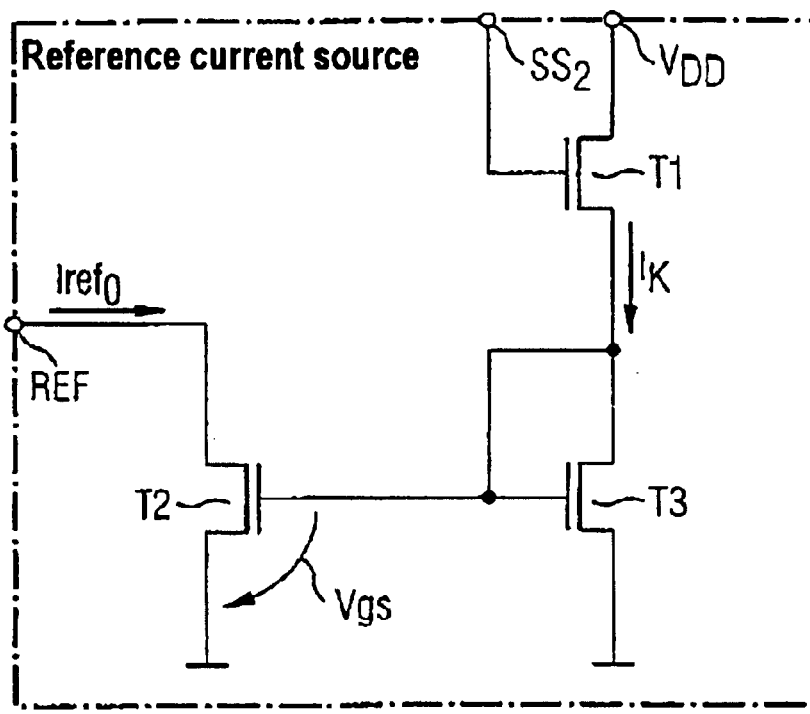
FIG. 3 shows a reference current source contained in the sense current amplifier LSV illustrated in FIG. 2, according to the prior art.
Figure 4:
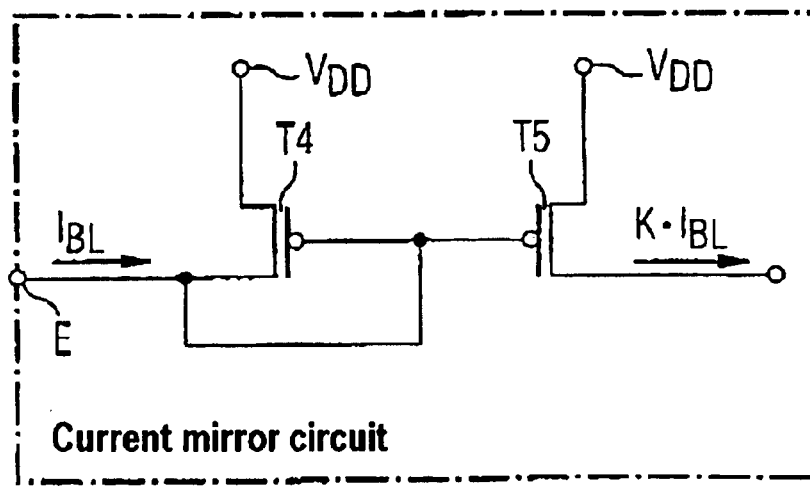
FIG. 4 shows a current mirror circuit contained in the sense current amplifier LSV illustrated in FIG. 2, according to the prior art.

The following description of the preferred developments of the invention are provided without limitation to the claims.

In preferred developments of the invention, the first and second current mirror circuits of the high-speed sense current amplifier according to the invention are preferably connected to the memory signal line in parallel with one another. In this case, the two current mirror circuits are preferably each constructed from two MOSFETs whose gate terminals are connected to one another.

In a preferred embodiment of the high-speed sense current amplifier, the first current mirror circuit has a first MOSFET whose gate terminal and whose source terminal are connected to the memory signal line and whose drain terminal is connected to a supply voltage, and has a second MOSFET, whose gate terminal is connected to the gate terminal of the first MOSFET, whose drain terminal is connected to the supply voltage $V_{DD}$ and whose source terminal is connected to the signal output of the sense current amplifier.

In a preferred embodiment of the high-speed sense current amplifier, the second current mirror circuit has a first MOSFET, whose gate terminal and whose source terminal are connected to the memory signal line and whose drain terminal is connected to a supply voltage $V_{DD}$, and has a second MOSFET, whose gate terminal is connected to the gate of the first MOSFET, whose drain terminal is connected to the supply voltage, $V_{DD}$ and whose source terminal is connected to the setting line for outputting the setting current.

The adjustable reference current source of the sense current amplifier preferably has a current mirror circuit for the adjustable amplification of a constant current, the current mirror circuit having a first MOSFET, whose drain terminal is connected, at a reference current source terminal of the reference current source for outputting an amplified adjustable reference current, to the signal output of the sense current amplifier, whose source terminal is connected, at a setting terminal of the reference current source, to the setting line for receiving the setting current, and whose gate terminal is connected to a gate terminal of a second MOSFET of the current mirror circuit.

The adjustable reference current which can be output by the reference current source is preferably set in a manner dependent on the setting current received via the setting terminal.

In this case, the received setting current is preferably used to set the voltage $V_{GS}$ between the gate terminal and the source terminal of the first MOSFET of the current mirror circuit within the reference current source for the alteration of the adjustable reference current.

The output of the sense current amplifier preferably has a capacitance.

In a particularly preferred embodiment of the sense current amplifier, the signal output has a signal buffer circuit.

In a further preferred embodiment of the sense current amplifier, the memory signal line has a controlled multiplexer for switching the memory signal current through to the two current mirror circuits of the sense current amplifier.

The memory signal line is preferably connected to a charging circuit for charging or recharging the memory signal line.

The memory cell is a RAM memory cell or ROM memory cell.

With reference to FIG. 1, a memory cell 1 is addressed by an address decoder (not illustrated) via a word line 2 and outputs a memory signal current via a memory signal line or bit line 3. The memory signal line 3 is connected via a line 4 to a charging circuit 5 for charging or recharging the memory signal line 3. The memory signal line 3 is connected to an input 6 of a multiplexer circuit 7, which can be controlled via a control line 8 for through-connecting the memory signal line 3 to an output line 9 of the multiplexer circuit 7. The line 9 is connected to a signal input 10 of the high-speed sense current amplifier 11. The signal input 10 of the high-speed sense current amplifier 11 is connected via an internal line 12 to a signal input 13 of a current mirror circuit 14. The current mirror circuit 14 is supplied with a supply voltage $V_{DD}$ via a supply voltage line 15. The current mirror circuit 14 has a current output 16, via which the current mirror circuit 14 outputs the memory signal current $I_{BL}$ received at the signal input 13, after having amplified the current, to a current node 18 via a line 17. The current node 18 is connected to a signal output 20 of the sense current amplifier 11 via an internal output line 19 of the sense current amplifier 11. The current node 18 is furthermore connected via a line 21 to a reference current source terminal 22 of an adjustable reference current source 23. The adjustable reference current source 23 is connected to the supply voltage $V_{DD}$ via a supply voltage line 24. The adjustable reference current source furthermore has a grounding line 25 connection to ground GND. The adjustable reference current source 23 receives a selection signal SS2 via a control line 26.

The current mirror circuit 14 has an output terminal 27, which is connected via a setting line 28 to a current setting input 29 of the reference current source 23. Via the setting line 28, the current mirror circuit 14 sets the magnitude of the reference current ref output by the reference current source 23 at the reference current source terminal 22.

The output 20 of the sense current amplifier 11 is connected to a data buffer 22 via an output line 21. The data buffer 22 preferably comprises a series circuit of inverter gates. The data buffer 22 has an output line 23—for connection to an internal data bus.

The summation current node 18 connected to the signal output 20 of the sense current amplifier 11 has an intrinsic capacitance of 30.

Figure 6:
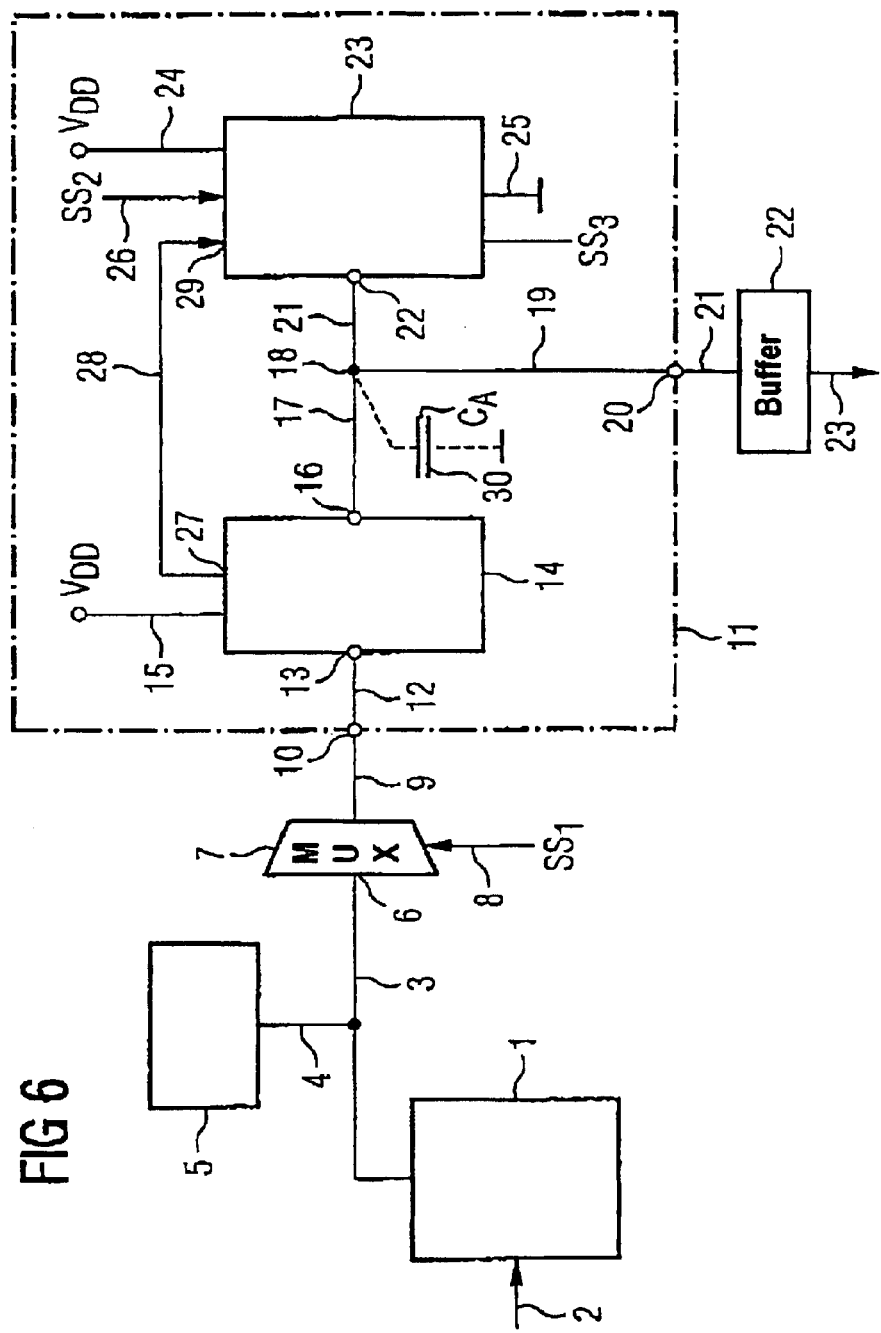
FIG. 6 shows a circuit diagram with a high-speed sense current amplifier according to the invention.
Figure 7:
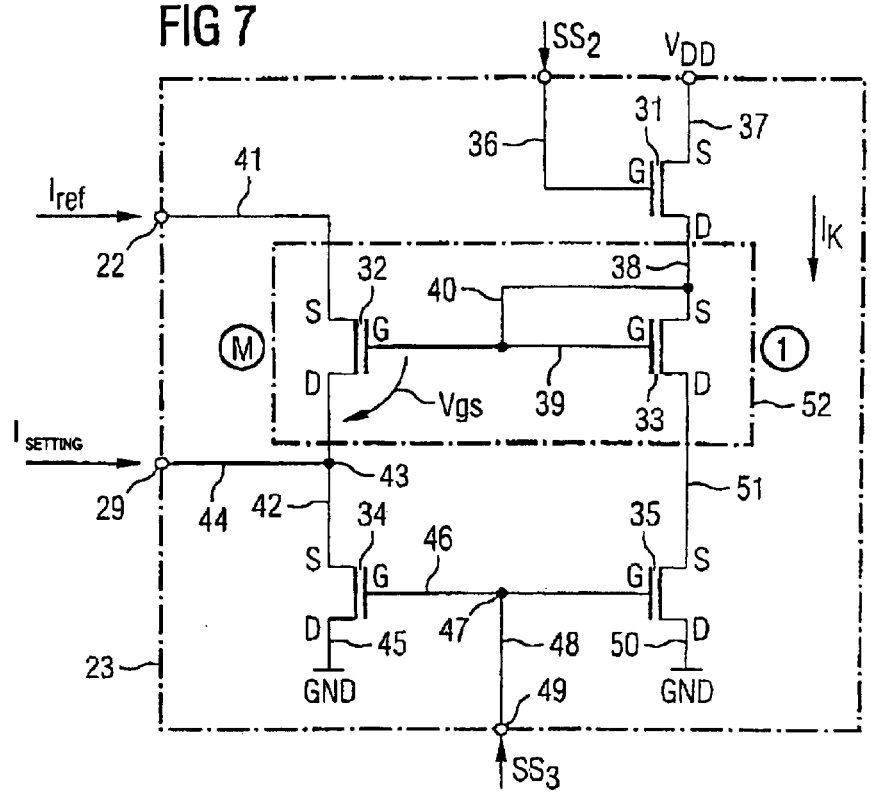
FIG. 7 shows an adjustable reference current source contained in the sense current amplifier according to the invention as illustrated in FIG. 6.

FIG. 7 shows in detail the adjustable reference current source 23 illustrated in FIG. 6. The adjustable reference current source 23 contains five N-MOSFETs 31, 32, 33, 34, and 35. The gate terminal of the MOSFET 31 is controlled by the selection signal SS2 via a line 36. The source terminal of the MOSFET 31 is supplied with the supply voltage VDD via a line 37. The drain terminal of the MOSFET 31 is connected to the source terminal of the MOSFET 33 via a line 38. The two gate terminals of the MOSFET5 32, 33 are connected to one another via a connecting line 39. In this case, the two lines 38 and 39 are short-circuited via a line 40. The source terminal of the MOSFET 32 is connected to the reference current source terminal 22 via a line 41. The source terminal of the MOSFET 34 is connected to the drain terminal of the MOSFET 32 via a line 42. The line 42 which connects the two MOSFETS 32 and 34 to one another is connected to the setting terminal 29 of the reference current source 23 at a node 43 via a line 44. The drain terminal of the MOSFET 34 is connected to ground via a line 45. The two gate terminals of the MOSFETs 34 and 35 are connected to one another via a connecting line 46, which is connected, at a node 47, via a line 48 to a control terminal 49 for application of a selection signal SS3. The drain terminal of the MOSFET 35 is likewise connected to ground via a grounding line 50. The source terminal of the MOSFET 35 is connected to the drain terminal of the MOSFET 33 via a line 51.

If the selection signal SS2 is logic high, the MOSFET 31 is turned on and generates a constant current $I_K$, which is mirrored by a current mirror circuit. In this case, the current mirror circuit 52 of the adjustable reference current source is formed by the two MOSFETs 32 and 33. The reference current $I_{REF}$ taken up at the reference current source terminal 22 is set in a variable manner dependent on the setting current $I_{SETTING}$ captured at the setting terminal 29.

The following holds true:

$$I_{REF}(V_{GS32}) = \frac{\mu C_{ox} W/L}{2}(V_{GS32} - V_{T32})^2 \quad (5)$$

The adjustable reference current $I_{REF}$ output by the reference current source 23 depends on the gate/source voltage across the MOSFET 32.

If the selection signal SS3 is on, as the setting current $I_{SETTING}$ increases, the gate/source voltage $V_{GS32}$ across the MOSFET 32 decreases and the reference current $I_{REF}$ generated at the reference current terminal 22 falls.

Consequently, the following holds true:

$$I_{REF} = I_{REF}(I_{SETTING}) \quad (6)$$

The gain ratio with which the constant current IK is mirrored after having been amplified by the current mirror circuit 52 is defined by the channel width/length ratio (W/L) of the MOSFET transistors 32 and 33. Typical gain factors M lie in a range of 1–10.

Figure 8:
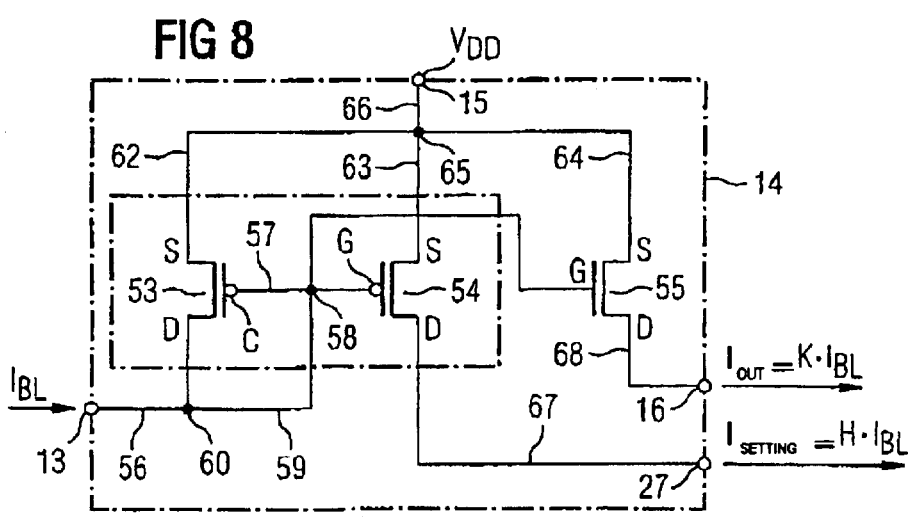
FIG. 8 shows the current mirror circuits contained in the sense current amplifier according to the invention as illustrated in FIG. 6.

FIG. 8 shows in detail the current mirror circuit 14 according to the invention as illustrated in FIG. 6. The current mirror circuit 14 receives, via the signal 10 input 13, the memory signal current output by the memory cell 1 and is supplied with the supply voltage $V_{DD}$ via the voltage supply line 15. The current mirror circuit 14 furthermore has a current output 16 for outputting an amplified memory signal current and a setting output terminal 27 for outputting a setting current $I_{SETTING}$. The current mirror circuit 14 contains three P-MOSFETs 53, 54 and 55. The drain terminal of the P-MOSFET 53 is connected via a line 56 to the signal input 13 of the current mirror circuit 14. The two gate terminals of the MOSFETs 53, 54 are connected to one another via a connecting line 57. At a potential node 58, the connecting line 57 between the two P-MOSFETs 53 and 54 is connected to the line 56 at a branching node 60 via a line 59. The node 58 is furthermore connected to the gate terminal of the P-MOSFET 55 via a line 61. The source terminals of the P-MOSFETs 53, 54 and 55 are connected via voltage supply lines 62, 63 and 64 to a node 65, which is connected to the supply voltage $V_{DD}$ via a line 66. The drain terminal of the P-MOSFET 54 is connected via a line 67 to the setting output terminal 27 of the current mirror circuit 14. The drain terminal of the P-MOSFET 55 is connected via a line 68 to the current output terminal 16 of the current mirror circuit.

The current mirror circuit 14 according to the invention as illustrated in FIG. 8 contains a first current mirror circuit, formed by the two P-MOSFETs 53, 55, and a second current mirror circuit, formed by the two P-MOSFETs 53, 54. The first current mirror circuit 53 and 55 amplifies the memory signal current $I_{BL}$ output by the memory cell 1 via the memory signal line 3 with a gain factor K and outputs the amplified memory signal current at the current output 16.

The second current mirror circuit 53 and 54 generates a setting current $I_{SETTING}$ in a manner dependent on the memory signal current $I_{BL}$ received at the signal input 13. For this purpose, the reception the memory signal current is amplified with a gain H.

The following holds true:

$$I_{SETTING} = H \cdot I_{BL} \quad (7)$$

The two gain factors K and H can be defined by the channel width/length ratios of the P-MOSFET transistors 53, 54 and 55.

Figure 5:
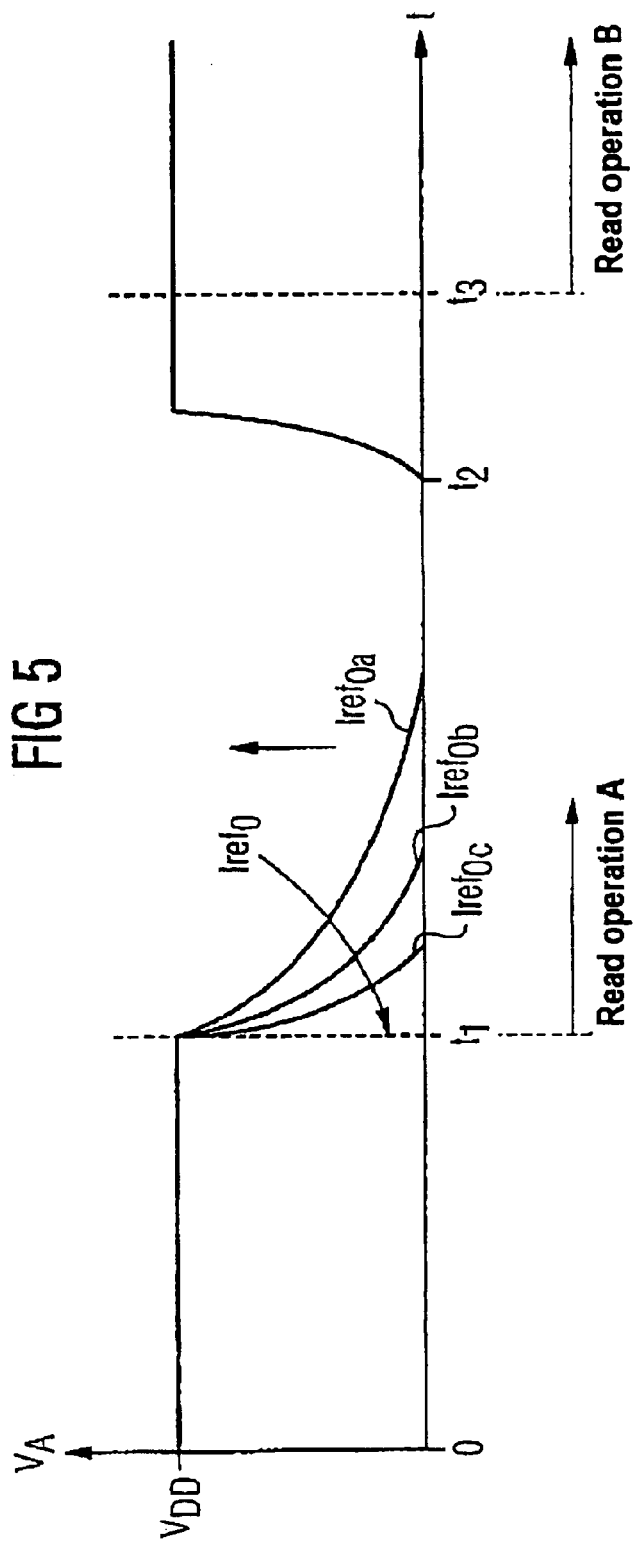
FIG. 5 shows a signal timing diagram for elucidating the problem area on which the invention is based.

If, during a memory read operation B, the memory signal current $I_{BL}$ is high when reading out a logic high state in the memory cell 1, the setting current $I_{SETTING}$ is likewise high. The high setting current $I_{SETTING}$ is fed via the setting line 28 to the setting terminal 29 of the controllable reference current source 23, so that the gate/source voltage $V_{GS}$ between the gate terminal and the source terminal of the N-MOSFET 32 decreases. Consequently, in accordance with equation (5), the adjustable reference current $I_{REF}$ decreases as the gate/source voltage decreases. Therefore, in the sense current amplifier 11 according to the invention, the power loss P is low during the read operation B (as is illustrated in FIG. 5) and on account of the reference current $I_{REF}$ that is set low.

Conversely, if a low signal memory current $I_{BL}$ is read from the memory cell 1 during the memory read operation A, the setting current $I_{SETTING}$ decreases in accordance with equation (7) and the gate/source voltage at the MOSFET 32 within the controllable reference current source 23 rises. In accordance with equation (5), the set reference current $I_{REF}$ output by the controllable reference current source 23 likewise rises as a result of this. On account of the rising reference current $I_{REF}$, the required memory read-out time decreases considerably as the discharge time τ falls, in accordance with equation (4). As a result, it is possible to achieve considerably higher read-out speeds for reading from the semiconductor memory.

The sense current amplifier 11 according to the invention enables at least a doubling of the read-out speed for reading from the memory cell 1 of a semiconductor memory.

The drain and source terminals (D, S) of the MOSFETs illustrated in FIGS. 7 and 8 are interchangeable.

The high-speed sense current amplifier 11 according to the invention with a low power consumption for a memory cell 1 guarantees a high changeover speed at the output of the sense current amplifier in the case of the read operation A (see FIG. 5), i.e. for a low memory signal current read out, on account of the high reference current $I_{REF}$ and a low power consumption P in the case of a read operation B, i.e. in the event of a high memory signal current on account of the reference current $I_{REF}$ set low, since the value of the reference current is adapted to the to the value of the memory signal current. Consequently, there is no need to increase the mirror gain K.

Although other modifications and changes may be suggested by those skilled in the art, it is the intention of the inventors to embody within the patent warranted hereon all changes and modifications as reasonably and properly come within the scope of their contribution to the art.

What is claimed is:

1. A high-speed sense current amplifier with a low power consumption for a memory cell, comprising:

a first current mirror circuit which amplifies a memory signal current received from the memory cell via a memory signal line and outputs it at a signal output of the sense current amplifier;

a second current mirror circuit which generates a setting current dependent on the memory signal current received from the memory cell; and an adjustable reference current source which outputs a reference current to said signal output of the sense current amplifier, a magnitude of the reference current being set via a setting line dependent on the setting current generated by said second current mirror circuit.

2. A high-speed sense current amplifier according to claim 1, wherein said first current mirror circuit and said second current mirror circuit are connected to said memory signal line in parallel with one another.

3. A high-speed sense current amplifier according to claim 1, wherein said first and second current mirror circuits each include two MOSFETS whose gate terminals are connected to one another.

4. A high-speed sense current amplifier according to claim 1, wherein said first current mirror circuit includes a first MOSFET whose gate terminal and whose source terminal are connected to said memory signal line and whose drain terminal is connected to a supply voltage, and said first current mirror circuit includes a second MOSFET whose gate terminal is connected to said gate terminal of said first MOSFET and whose drain terminal is connected to the supply voltage and whose source terminal is connected to said signal output of the sense current amplifier.

5. A high-speed sense current amplifier according to claim 4, wherein said setting current is used to set a voltage between said gate terminal and said source terminal of said first MOSFET of said further current mirror circuit within the reference current source for amplifying the reference current.

6. A high-speed sense current amplifier according to claim 1, wherein said second current mirror circuit includes a first MOSFET whose gate terminal and whose source terminal are connected to said memory signal line and whose drain terminal is connected to a supply voltage, and said second current mirror circuit includes a second MOSFET whose gate terminal is connected to said gate terminal of said first MOSFET and whose drain terminal is connected to the supply voltage and whose source terminal is connected to said setting line for outputting the setting current.

7. A high-speed sense current amplifier according to claim 1, wherein said adjustable reference current source includes a further current mirror circuit for the adjustable amplification of a constant current, said further current mirror circuit having a first MOSFET whose drain terminal is connected at a reference current source terminal of said reference current source for outputting an amplified adjustable reference current to said signal output of the sense current amplifier and whose source terminal is connected at a setting terminal of said reference current source to said setting line for receiving the setting current and whose gate terminal is connected to a gate terminal of a second MOSFET of the current mirror circuit.

8. A high-speed sense current amplifier according to claim 1, wherein the adjustable reference current which is output by said reference current source is set dependent on the setting current received via said setting terminal.

9. A high-speed sense current amplifier according to claim 1, wherein said signal output of the high-speed sense current amplifier has a capacitance.

10. A high-speed sense current amplifier according to claim 1, further comprising:
a signal buffer circuit at said signal output of the high-speed sense current amplifier.

11. A high-speed sense current amplifier according to claim 1, further comprising:
a controlled multiplexer at said memory signal line has for switching the memory signal current through to said first and second current mirror circuits of the high-speed sense current amplifier.

12. A high-speed sense current amplifier according to claim 1, further comprising:
a charging circuit connected to said memory signal line for charging or recharging said memory signal line.

13. A high-speed sense current amplifier according to claim 1, wherein said memory cell is a RAM memory cell.

14. A high-speed sense current amplifier according to claim 1, wherein said memory cell is a ROM memory cell.

* * * * *

UNITED STATES PATENT AND TRADEMARK OFFICE
CERTIFICATE OF CORRECTION

PATENT NO.   : 6,798,252 B2
DATED        : September 28, 2004
INVENTOR(S)  : Martin Ekkart et al.

It is certified that error appears in the above-identified patent and that said Letters Patent is hereby corrected as shown below:

<u>Title page,</u>
Item [75], Inventors, change the name of the first named inventor from "Martin Ekkart" to read -- Ekkart Martin --

Signed and Sealed this

Fourth Day of January, 2005

JON W. DUDAS
*Director of the United States Patent and Trademark Office*